United States Patent
Ker et al.

(10) Patent No.: US 7,049,659 B2
(45) Date of Patent: May 23, 2006

(54) METHOD OF MANUFACTURING AN ESD PROTECTION DEVICE WITH THE SAME MASK FOR BOTH LDD AND ESD IMPLANTATION

(75) Inventors: Ming-Dou Ker, Hsinchu (TW); Hsin-Chyh Hsu, Taoyuan (TW); Wen-Yu Lo, Taichung (TW)

(73) Assignee: Silicon Intergrated Systems Corp., Hsinchu (TW)

( * ) Notice: Subject to any disclaimer, the term of this patent is extended or adjusted under 35 U.S.C. 154(b) by 0 days.

(21) Appl. No.: 10/658,772

(22) Filed: Sep. 10, 2003

(65) Prior Publication Data
US 2005/0051848 A1    Mar. 10, 2005

(51) Int. Cl.
*H01L 29/94* (2006.01)
(52) U.S. Cl. .................. 257/344; 257/336; 257/408
(58) Field of Classification Search ............. 257/336, 257/344, 408
See application file for complete search history.

(56) References Cited

U.S. PATENT DOCUMENTS

| | | | |
|---|---|---|---|
| 4,199,733 A * | 4/1980 | Schade, Jr. ............ 330/277 |
| 5,047,358 A * | 9/1991 | Kosiak et al. ............ 438/200 |
| 5,200,352 A * | 4/1993 | Pfiester ............ 438/231 |
| 5,559,352 A | 9/1996 | Hsue et al. |
| 5,672,527 A | 9/1997 | Lee |
| 5,744,372 A * | 4/1998 | Bulucea ............ 438/231 |
| 5,953,601 A | 9/1999 | Shiue et al. |
| 6,114,226 A | 9/2000 | Chang et al. |
| 6,396,103 B1 * | 5/2002 | Riccobene et al. ........ 257/335 |

* cited by examiner

*Primary Examiner*—Allan R. Wilson
(74) *Attorney, Agent, or Firm*—Birch, Stewart, Kolasch & Birch, LLP

(57) ABSTRACT

A method of manufacturing a semiconductor device having a first and second transistor of an ESD protection and internal circuit respectively. The method includes the steps of providing a substrate, forming gates of the first and second transistor on the substrate, depositing a mask layer and patterning the mask layer using one single mask to remove the mask layer on the gates, a portion of a drain region of the first transistor, and a source and drain region of the second transistor, implementing ESD implantation under the regions without the patterned mask layer, removing the mask layer and forming sidewall spacers of the gates, and implementing drain diffusion.

5 Claims, 11 Drawing Sheets

METHOD OF MANUFACTURING AN ESD PROTECTION DEVICE WITH THE SAME MASK FOR BOTH LDD AND ESD IMPLANTATION

BACKGROUND OF THE INVENTION

1. Field of the Invention

The present invention relates to a method of manufacturing a semiconductor device, and more particularly to fabricating, by the deep-sub-quarter CMOS process, an ESD protection circuit with low junction capacitance, low leakage current and high ESD protection.

2. Description of the Prior Art

Electrostatic discharge (ESD) occurs when a relatively large amount of voltage or charge generated by rubbing different materials is discharged in a pulse lasting from several to hundreds of nano-seconds depending on the discharge model. Component-level ESD stress on IC products is classified into three models: the human-body model (HBM), the machine-model (MM) and the charged-device model (CDM). To achieve an ESD protection device with reasonable ESD robustness (typically ±2 kV in the HBM ESD stress, ±200V in the MM ESD stress, and ±1000V in the CDM ESD stress) and compliant with general industrial specifications, several methods are proposed to enhance the ESD protection in of the IC products.

The elements that initially encounter an ESD pulse in an integrated circuit are typically input/output(I/O) buffers. The I/O buffers are directly connected to a chip bond pads or terminals thereon which are exposed to the external environment, as shown in FIG. 1. When an ESD pulse is applied to the I/O pad, a large ESD current (several amperes) is discharged through some current paths in the IC. The large ESD current may damage the gate oxide or cause current crowding around the weakest channel surface of the drain side, causing portions of the MOSFET device to burn out, if proper ESD protection circuits are not properly provided in the IC.

Achieving a high level of ESD protection in IC products fabricated by the sub-quarter-micron CMOS process is challenging as the diffusion junction depth is reduced, and the LDD structure and silicidation are generally employed therein. Therefore, it is necessary to integrate ESD protection circuits and devices on the chip to protect the internal circuits from ESD damage. The MOSFET devices shown in FIG. 1 are used as ESD clamp devices to discharge ESD current, and ESD protection capability thereof is dependent upon the level of ESD robustness provided by the clamp devices.

In sub-quarter-micron CMOS technology, the NMOS is fabricated with an LDD structure to overcome the hot-carrier issue. The drain contact to poly spacing ($S_{DG}$) of the NMOS is achieved by an additional silicide-blocking mask (RPO), which removes $CoSi_2$ silicide at both source and drain regions, providing ESD protection. The LDD structure, however, often degrades ESD robustness. To improve ESD robustness, one additional ESD implantation mask is used in some CMOS processes to eliminate the LDD peak structure. There are several U.S. patents disclosing device structures modified by the ESD implantation for improving ESD robustness.

There are generally two types of ESD implantation, N-type and P-type, as shown in FIGS. 2 and 3, respectively. A typical process flow of N-type arsenic ESD implantation is shown in FIG. 4. Subsequent to implantation of the LDD structure, sidewall spacers are formed on all the devices including the ESD protection devices and internal devices. After source/drain implantation, the ESD protection devices are patterned by the ESD mask so that the sidewall spacers are removed therefrom. The resulting, N-type ion implantation region covers the entire source/drain region and envelops the LDD peak structure in the ESD protection devices. Further, in U.S. Pat. No. 5,672,527, Lee discloses a similar N-type ESD implantation method, wherein the ESD protection devices are formed before the sidewall spacers. The entire source/drain region and the LDD structure of the ESD protection devices are covered by the ESD implantation region but the sidewall spacers are not removed. However, these ESD protection devices suffer an increased breakdown voltage.

In U.S. Pat. No. 5,559,352, Hsue discloses a method of forming an ESD protection device, including a high-energy and heavy P-type ESD implantation step wherein the ions are injected into the substrate through contact openings of the source and drain. The formed ESD implantation regions are located under the source/drain regions, which reduces the source/drain to P-substrate junction breakdown voltage. Therefore, the ESD protection device can be turned on quickly to protect the thin gate oxide of the internal circuit from ESD damage.

In U.S. Pat. No. 5,953,601, Shiue discloses a method of forming an ESD protection device wherein a deeply doped region of opposite conductivity (P-type for NMOS) is formed under the center of the source and drain of the ESD protection device before silicidation. This device structure is similar to Hsue's but additionally avoids silicide degradation and increase of contact resistance, which results from the transportation of metal ions into the depleted region of the junction during the high-energy ESD implantation.

In U.S. Pat. No. 6,114,226, Chang discloses a method of forming an ESD protection device including steps of covering the internal circuit and a portion of the silicide layer of the ESD protection device with a mask layer, etching the silicide layers uncovered by the mask layer to expose the conductive layer and a portion of the source/drain region, forming heavy P-type doped regions by ion implantation under the masking of the mask layer, and implementing another ion implantation to form an ESD implantation region under the entire drain region and enveloping the LDD structure. The heavy P-type ESD implantation region is located under a portion of the source/drain regions to form Zener junctions, which reduces the junction breakdown voltage. Moreover, the N-type ESD implantation avoids the ESD robustness degradation resulting from the LDD structure. However, the Zener junction formed by the P-type ESD implantation has a high leakage current and also increases the parasitic junction capacitance of the ESD protection device.

In mixed-voltage ICs, the core logic circuits operate at a low voltage level but the I/O circuits operate at a higher voltage level. The ESD implantation essential to the ESD protection device decreases the Zener junction breakdown voltage from 8V to 5V. As a result the ESD protection device becomes susceptible to faulty or unintentional triggered by noise or signal overshooting. In high-speed ICs, the parasitic junction capacitance of the ESD protection device is proportional to junction depletion depth. The P-type ESD implantation increases the junction capacitance of the Zener junction since the depletion width of the Zener junction in the ESD protection transistor is thinner than that of the device without the P-type implantation, which degrades the circuit speed of the I/O interface. Therefore, ESD protection devices with the P-type ESD implantation are not suitable for high-speed or mixed-voltage ICs.

SUMMARY OF THE INVENTION

The object of the present invention is to provide a manufacturing method of an ESD protection circuit with low junction capacitance, low leakage current and high ESD robustness using the deep-sub-micron CMOS process.

The present invention provides a method of manufacturing a semiconductor device having a first and second transistor respectively of an electrostatic discharge protection circuit and internal circuit. The method comprises the steps of providing a substrate, forming gates of the first and second transistor on the substrate, and patterning the mask layer region using one single mask to remove the mask layer from the gates, a portion of a drain region of the first transistor, and a source and drain region of the second transistor, implementing a first ion implantation with a first concentration under the masking of the patterned mask layer, removing the mask layer and forming sidewall spacers of the gates, and implementing a second ion implantation with a second concentration, wherein the concentration of the second implantation is heavier than that of the first implantation.

The present invention further provides an electrostatic discharge protection device coupled to a pad of an internal circuit. The device comprises a substrate, a gate formed on the substrate, a source and drain region formed in the substrate, the drain region is coupled to the pad and the source region is coupled to receive a reference voltage, and a lightly doped region formed in the substrate, and between the gate and the drain region only, said region having a depth greater than that of the drain region.

The present invention also provides a semiconductor device comprising a substrate, an internal circuit formed on the substrate with a first gate formed thereon and a first source and drain region formed in the substrate and on both sides of the first gate respectively, and an electrostatic discharge protection circuit formed on the substrate having a second gate formed on the substrate, and a second source and drain region formed in the substrate and on both sides of the second gate respectively, and a first and second lightly doped region formed in the substrate, wherein the first lightly doped region surrounds the first drain region, the second lightly doped region is only disposed between the second gate and the second drain region, and the first and second lightly doped region both have a depth greater than that of the first and second drain region.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

FIGS. 5A~5F are diagrams showing a method of manufacturing a semiconductor device with an ESD protection and internal circuit according to one embodiment of the invention. The ESD protection and internal circuits are composed of transistors.

Figure 1:
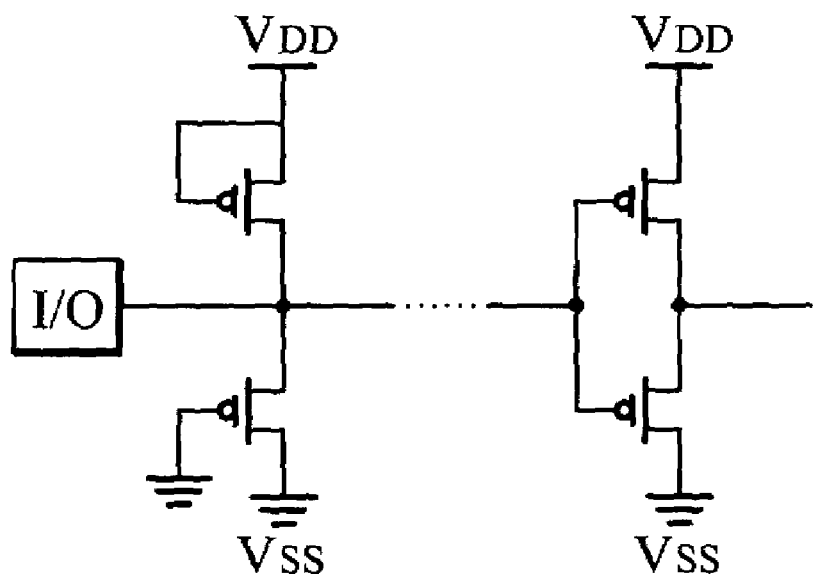
FIG. 1 shows a conventional on-chip ESD protection circuit with I/O buffer.
Figure 2:
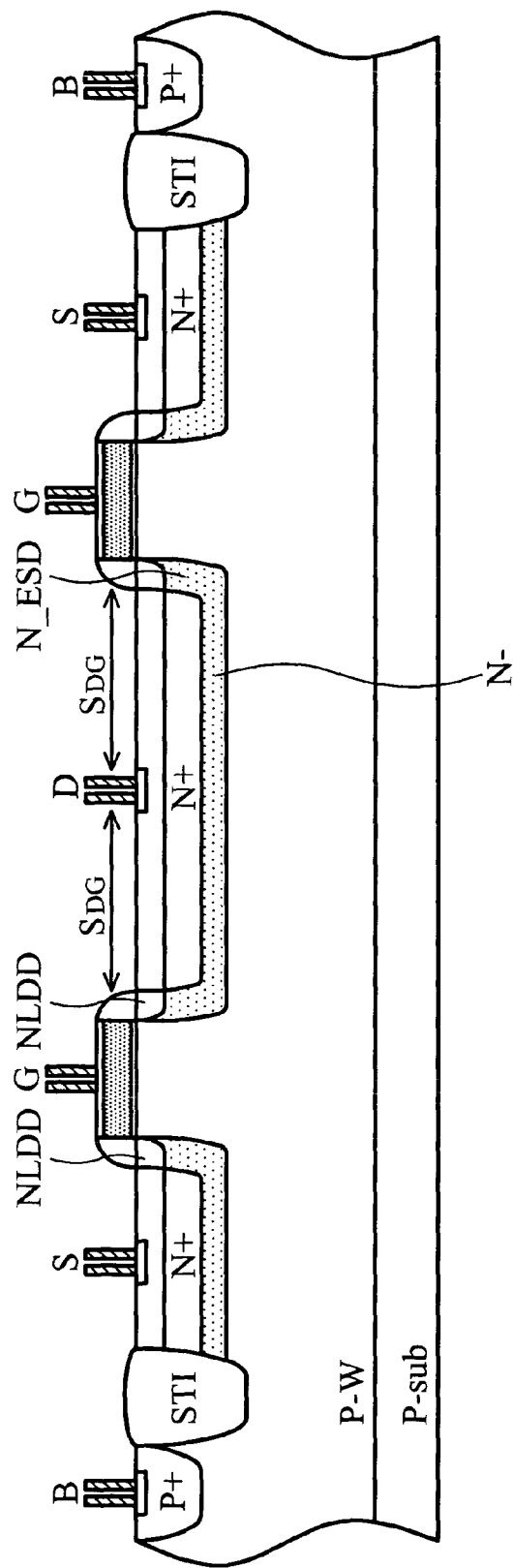
FIG. 2 shows a cross-section of a conventional ESD protection device with N-type ESD implantation.
Figure 3:
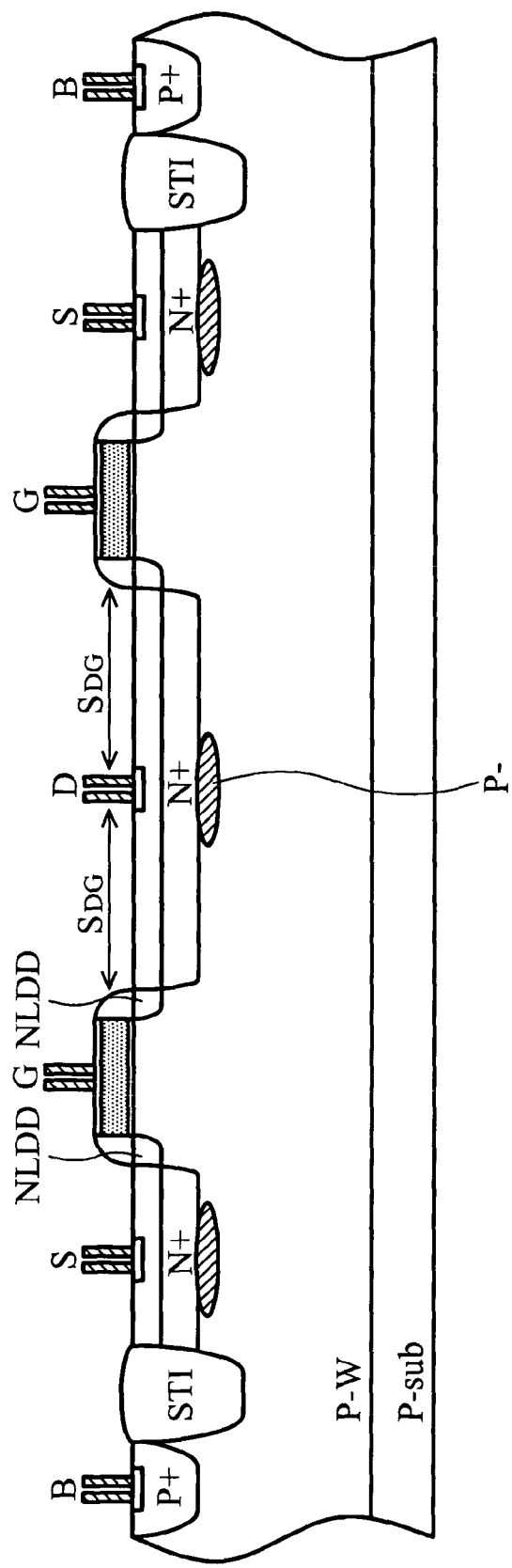
FIG. 3 shows a cross-section of a conventional ESD protection device with P-type ESD implantation.
Figure 4:
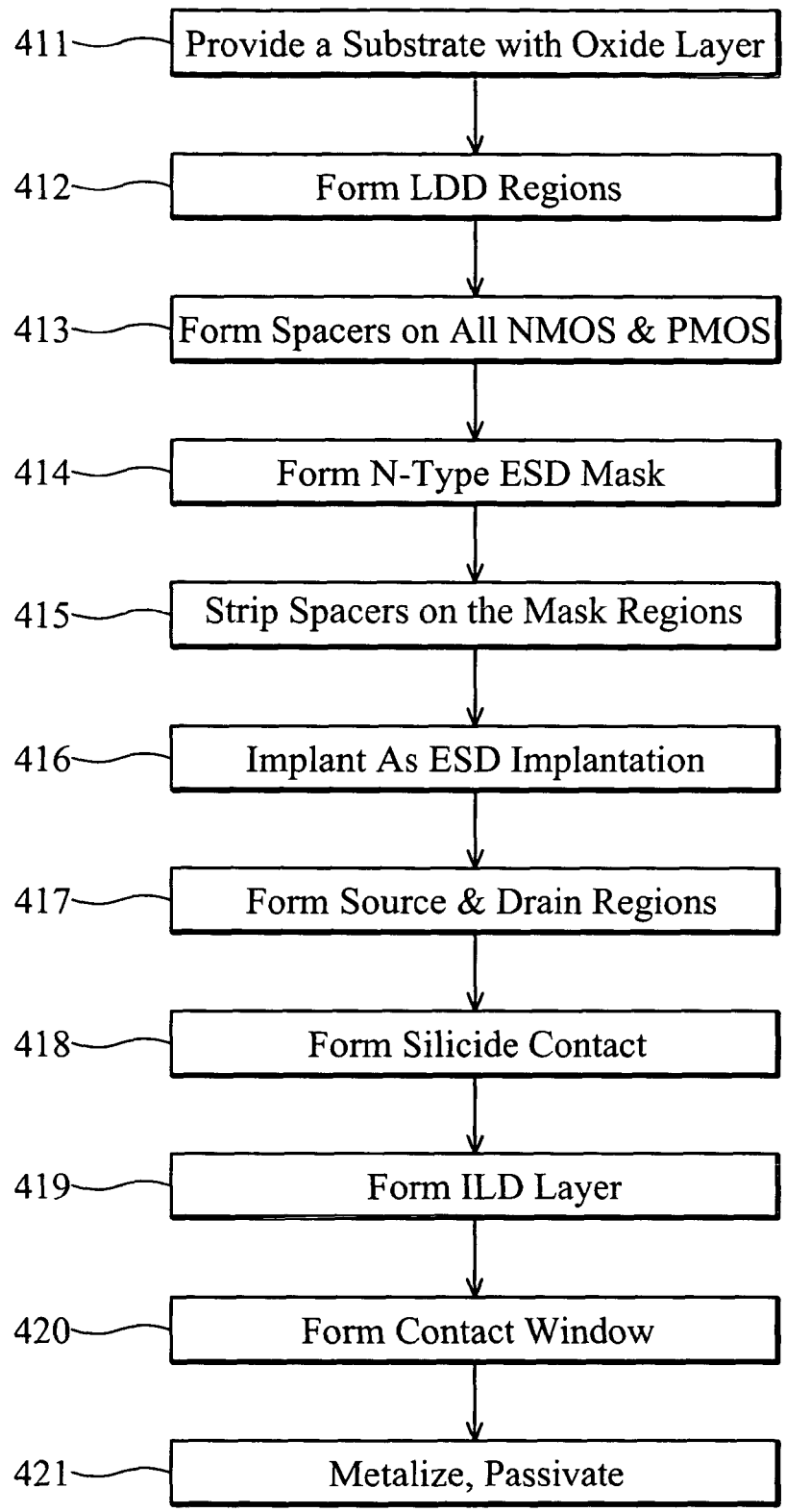
FIG. 4 shows a flowchart of a conventional method of manufacturing an ESD protection device.
Figure 5A:
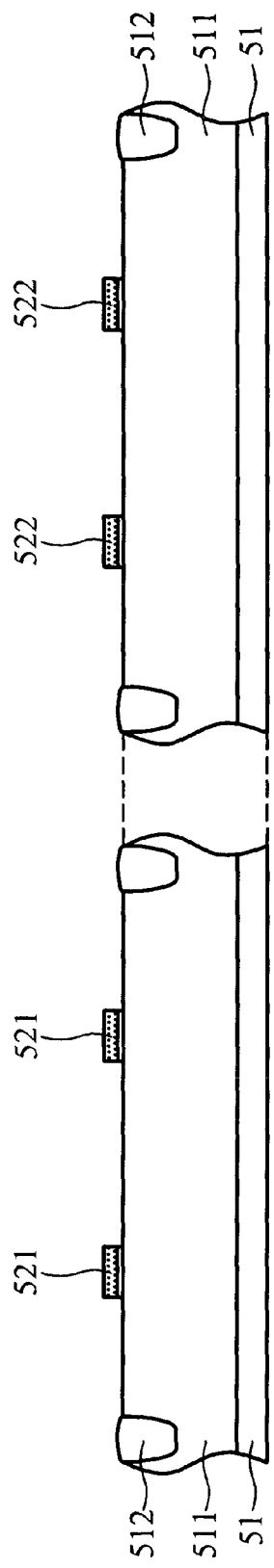
FIGS. 5A~5F are diagrams showing a method of manufacturing a semiconductor device with an ESD protection and internal circuit according to one embodiment of the invention.

As shown in FIG. 5A, a P-type substrate 51 with P well 511 and STI regions 512 formed thereon is provided. Gates 521 and 522 respectively of the transistors for the ESD protection circuit and internal circuit are formed on the P-type substrate 51.

Figure 5B:
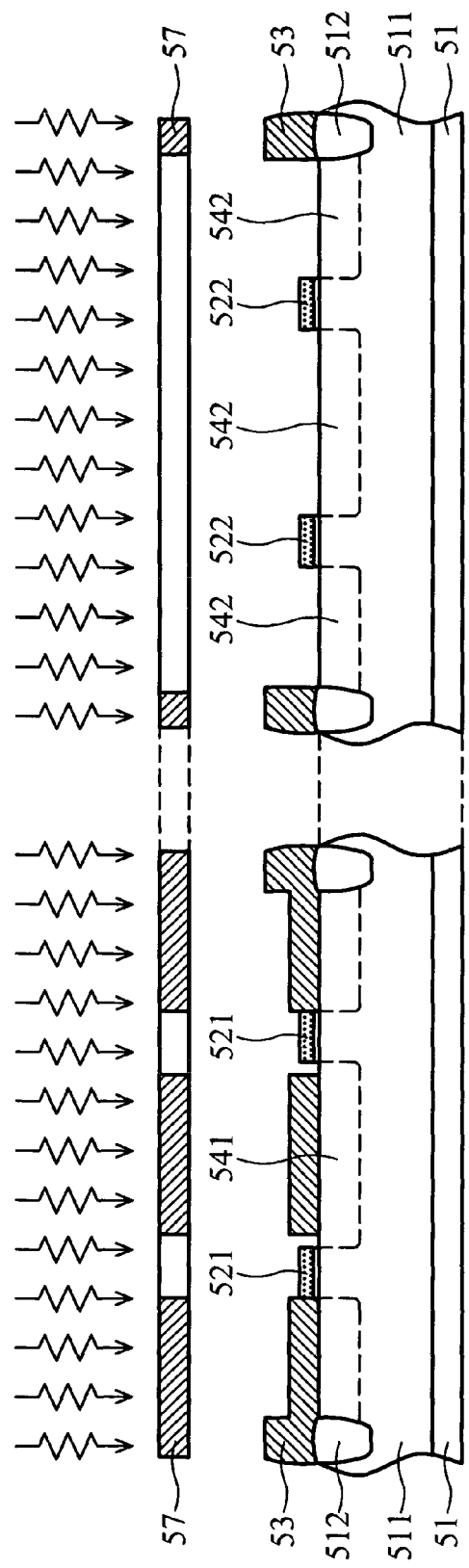

As shown in FIG. 5B, a mask layer 53 is deposited and patterned using one single mask 57 to remove portions of the mask layer 53 on the gates 521 and 522, portions of a drain regions 541 of the transistors for the ESD protection circuit, and source and drain regions 542 of the transistors for the internal circuit. The mask 57 is merged with the LDD mask into one mask defining the ESD implantation regions in the ESD protection circuit and the LDD structure in the internal circuit.

Figure 5C:
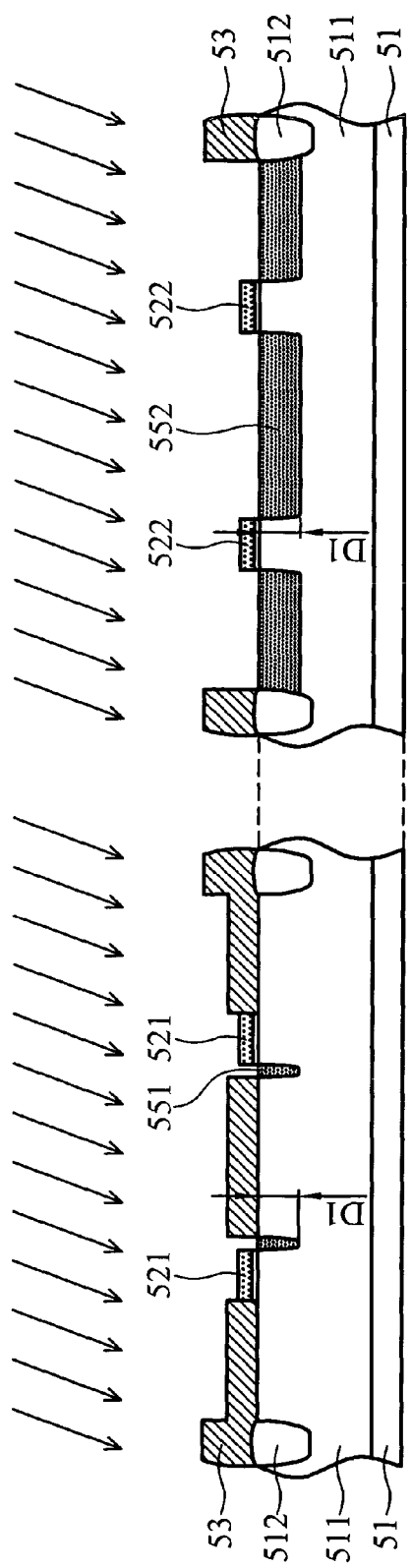

As shown in FIG. 5C, a first ion implantation step is implemented. The first ion implantation is an N$^-$-type ion implantation with a depth D1 under the region without the patterned mask layer. This step forms the ESD implantation regions 551 in the ESD protection circuit and the deep LDD regions 552 in the internal circuit.

Figure 5D:
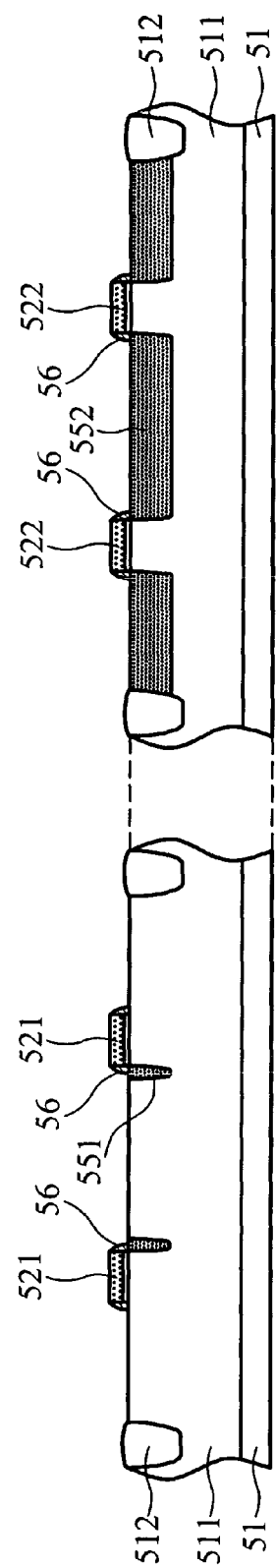

As shown in FIG. 5D, the mask layer 53 is removed and sidewall spacers 56 of the gates 521 and 522 are formed. The sidewall spacers 56 are interlayer dielectric formed by CVD (Chemical Vapor Deposition).

Figure 5E:
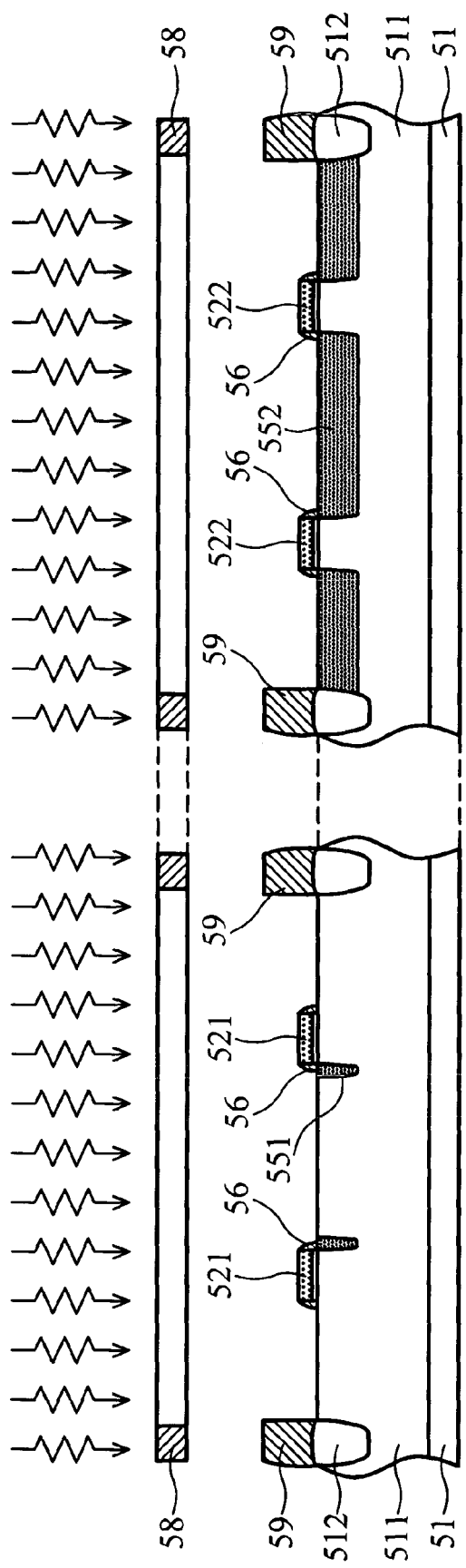

As shown in FIG. 5E, another mask layer 59 is deposited and patterned using an N+ diffusion mask 58 to remove portions of the mask layer 59 on all the drain and source regions of the transistors of the ESD protection and internal circuit.

Figure 5F:
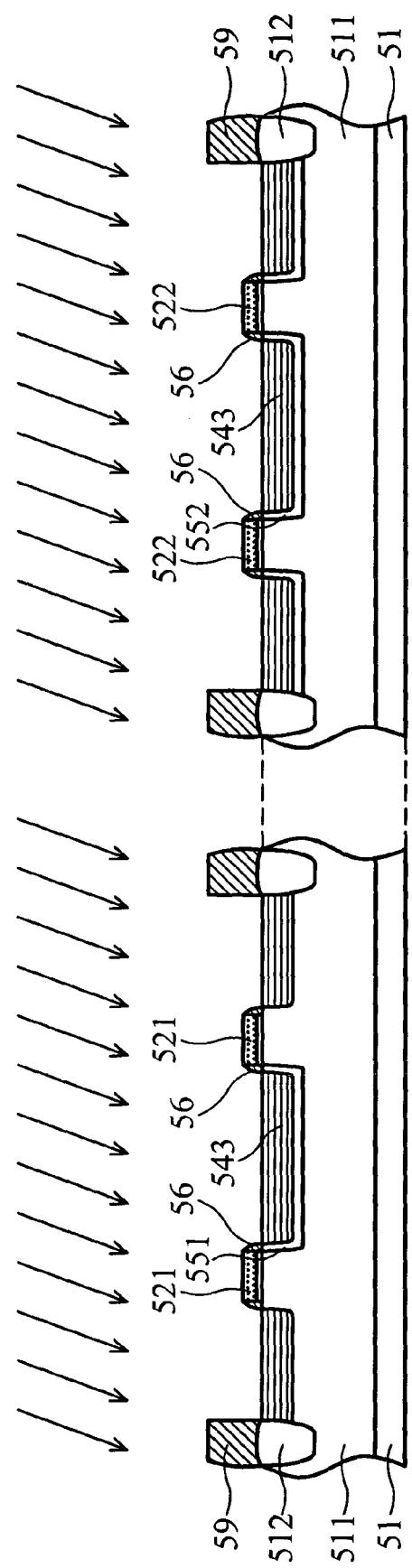

As shown in FIG. 5F, a second ion implantation step is implemented under the region without the patterned mask layer 59 to form N+ doped regions 543. The second ion implantation is an N$^+$-type ion implantation with a depth D2, wherein the depth D2 is less than the depth D1 of the first ion implantation. Afterwards, the mask layer 59 is removed.

The second ions implantation step is followed by conventional CMOS process steps, such as silicidation, metallization and formation of interconnections.

Figure 6:
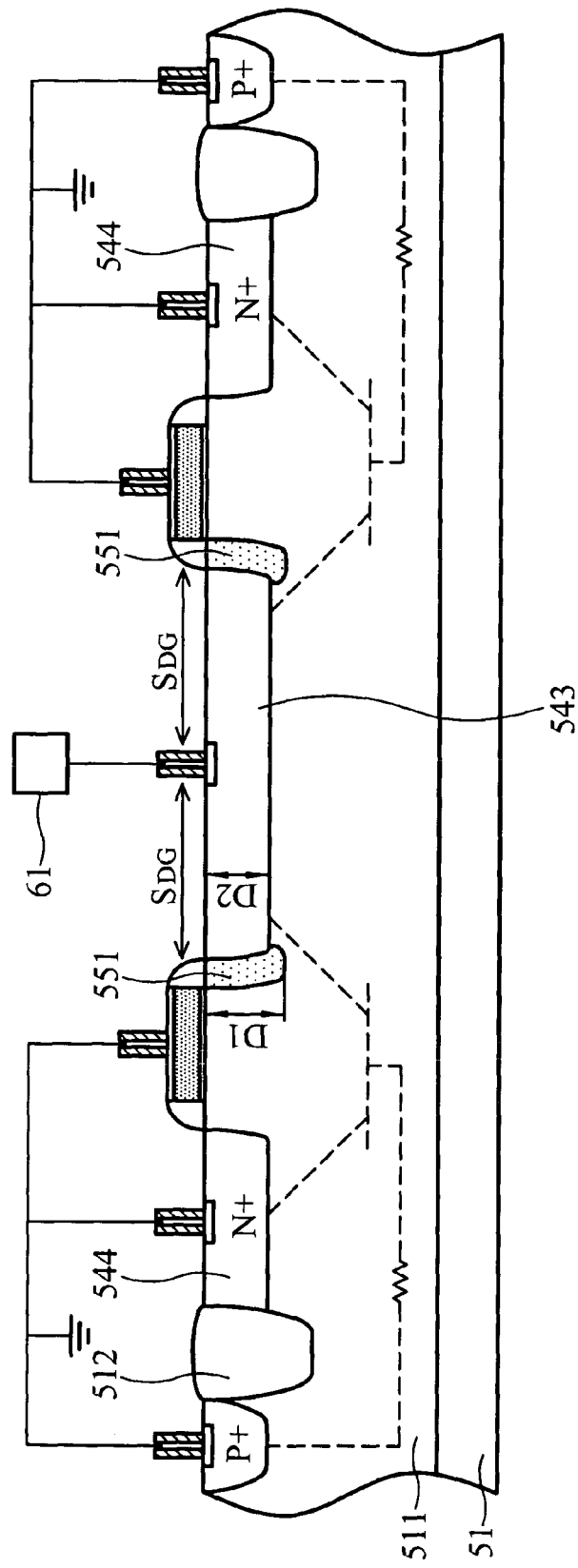
FIG. 6 shows a cross-section of an ESD protection circuit according to one embodiment of the invention.

FIG. 6 shows a cross-section of the ESD protection circuit manufactured by the previously described method. The circuit has the junction depth D1 slightly deeper than the junction depth D2 of the drain diffusion. The N$^-$-type ESD implantation region 551 envelops the original LDD region on the drain side 543 with the exception the regions under the drain 543 and source 544 diffusion regions in the ESD protection circuit. The drain 543 of the transistor of the ESD protection circuit is coupled to a pad 61 while the source 544 and gate thereof, and the substrate are coupled to ground. When a positive ESD voltage is applied to the pad 61, the drain of the ESD protection transistor breaks down and clamps the ESD voltage. Since the regions without the N⁻type ESD implantation have a lower breakdown voltage than that of the region with N-type ESD implantation, the ESD current first flows through these regions so that a substrate current is generated to trigger on the parasitic lateral NPN BJT in the NMOS device. The ESD current is finally discharged through the parasitic lateral NPN BJT. Thus, the ESD current path is far away from the weakest surface channel of the NMOS and the ESD current flows through a large area. This prevents the ESD protection circuit from false triggering by noise or signal overshooting. Moreover, the ESD robustness level provided by the circuit is effectively improved, particularly under the machine model (MM) stress.

Figure 7:
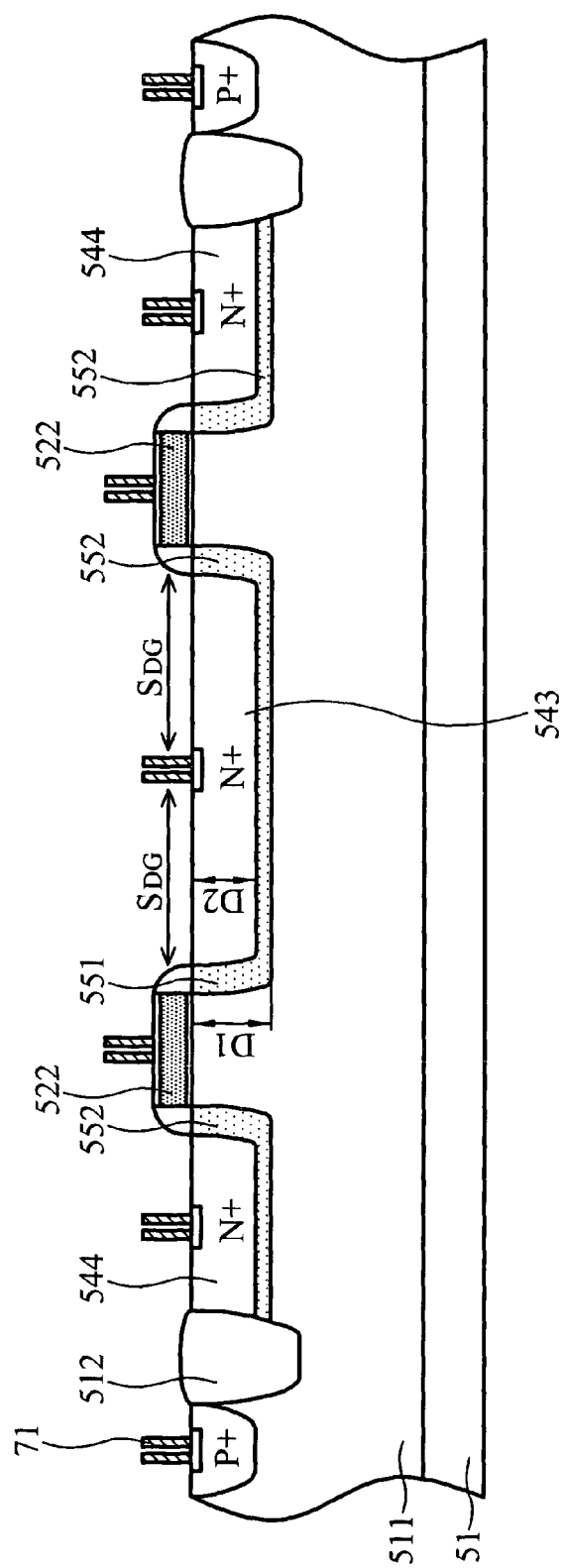
FIG. 7 shows a cross-sectional view of an internal circuit according to one embodiment of the invention.

Additionally, the doping concentration of the ESD implantation regions is lighter than that of the drain diffusion regions. The deeper LDD structure of the internal circuit is also formed by the N⁻-type ESD implantation, as shown in FIG. 7. Contacts 71 may be formed on the gates, sources and drains of the transistors for proper interconnections. The channel length of the ESD protection device is almost the same as that of the internal device with the traditional LDD structure. With a lighter doping concentration across the drain and source to P-substrate junctions, the parasitic junction capacitance of the internal circuit is further reduced, which increases the operating speed of the internal circuit.

Figure 8:
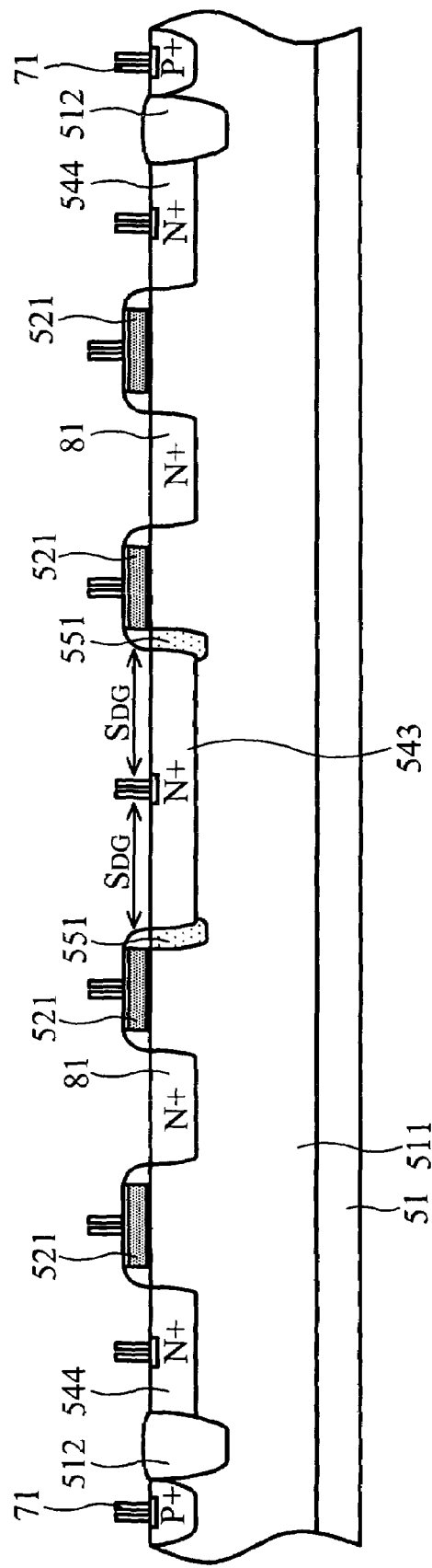
FIG. 8 shows a cross-sectional view of an ESD protection device with a stacked-NMOS structure according to one embodiment of the invention.

Alternatively, an ESD protection circuit with a stacked-configuration NMOS structure used for a mixed-voltage I/O interface may be fabricated by the method shown in FIGS. 5A~5E. The differences between the single and stacked-configuration MOSFET are the number of gates and additional N+ diffusion regions 81, as shown in FIG. 8.

In conclusion, the present invention provides a method for manufacturing an ESD protection device with a novel ESD implantation, method wherein the LDD and ESD implantation masks are merged into one single mask. It is process-compatible with general CMOS processes. Thus the formed ESD protection device has a lower cost, higher ESD protection, and higher operating speed than that of a traditional ESD protection device.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A semiconductor device comprising:
   a substrate;
   an internal circuit formed on the substrate, comprising:
   a first gate formed on the substrate; and
   a first source and drain region formed in the substrate and respectively on both sides of the first gate; and
   an electrostatic discharge protection circuit formed on the substrate, comprising:
   a second gate formed on the substrate; and
   a second source and drain region formed in the substrate and respectively on both sides of the second gate; and
   a first and second lightly doped region formed in the substrate, wherein the first lightly doped region surrounds the first drain region, the second lightly doped region is only disposed between the second gate and the second drain region, and the first and second lightly doped region both have a depth greater than that of the first and second drain region.

2. The semiconductor device as claimed in claim 1, wherein all the source and drain regions are N⁺ doped regions.

3. The semiconductor device as claimed in claim 1, wherein all the source and drain regions are P⁺ doped regions.

4. The semiconductor device as claimed in claim 1, wherein the first and second lightly doped regions are N⁻ type ESD implantation regions.

5. The semiconductor device as claimed in claim 1, wherein the first and second lightly doped regions are P⁻ type ESD implantation regions.

* * * * *